United States Patent [19]

Smith

[11] 4,454,602
[45] Jun. 12, 1984

[54] CONDUCTIVELY COOLED LASER DIODE ARRAY

[75] Inventor: Robert J. Smith, Rochester, N.Y.

[73] Assignee: McDonnell Douglas Corporation, Long Beach, Calif.

[21] Appl. No.: 362,086

[22] Filed: Mar. 26, 1982

[51] Int. Cl.³ .............................................. H01S 3/19
[52] U.S. Cl. ........................................ 372/36; 357/81
[58] Field of Search ............... 372/35, 36, 34; 357/17, 357/81

[56] References Cited

U.S. PATENT DOCUMENTS

| | | | |
|---|---|---|---|
| 3,590,248 | 6/1971 | Chatterton | 372/36 |
| 3,962,655 | 6/1976 | Selway et al. | 372/36 |
| 4,315,225 | 2/1982 | Allen et al. | 372/35 |

Primary Examiner—James W. Davie
Attorney, Agent, or Firm—Gregory A. Cone; George W. Finch; Donald L. Royer

[57] ABSTRACT

Room temperature operation of a multiple laser diode array is enabled without the need for liquid cooling by interleaving individual laser diode assemblies with electrically insulating but thermally conducting spacer heat sink layers which have electrically conducting portions adjacent the laser diode assembly such that the multiplicity of individual laser diode assemblies within the array may be operated electrically in series. The alternating leaves of the array are confined between top and bottom end plates, and the entire assembly is secured together by appropriate means.

6 Claims, 4 Drawing Figures

CONDUCTIVELY COOLED LASER DIODE ARRAY

BACKGROUND OF THE INVENTION

1. Field of the Invention

This invention relates to semiconductor lasers and heat sink assemblies therefor. More particularly, this invention relates to conductively cooled laser diode arrays containing a multiplicity of individual laser diodes.

2. Description of the Prior Art

Semiconductor injection laser diodes have many advantages. Their small size and mechanical stability have suggested their use in a variety of harsh environments which had previously excluded the use of other types of laser devices. The dimensions of an individual injection laser diode are typically submicron to a few microns across and usually no more than a fraction of a millimeter in length. The injection laser diodes are also capable of extremely high efficiencies compared to other types of lasers and may be used either in continuous or pulsed modes.

However, the efficient operation of an injection laser diode requires the dissipation of relatively large amounts of heat. In particular, in the case of a solid state laser rod pumped by emissions from either light emitting diodes or injection laser diodes, dissipation of heat from the diodes themselves becomes critical to both efficiency and the longevity for the individual diodes in the arrays. Since each individual diode is quite small, it becomes necessary to closely pack a plurality of individual diodes into arrays in order to generate the required amounts of input power to the larger pumped solid state laser rod in such situations. However, with increased packing densities of the individual diodes, the space available for extraction of heat from the individual diodes necessarily decreases, thereby aggravating the problem of heat extraction from the arrays of individual diodes. One solution that has been proposed in the past is to circulate a chilled fluid past the diodes in the arrays, often by pumping the chilled fluid through cooling passages within the arrays themselves. However, this solution greatly increases the cost, weight, and power consumption of the overall laser diode array assembly with an attendant overall decrease in system reliability due to the presence of the added cooling subsystem mechanisms. Also, the presence of the chilled fluid requires a stabilized lower temperature condition for the consistent operation of the overall laser system, which, in turn, requires cool down period prior to operation of the system. One such liquid cooled laser diode array is disclosed in U.S. Pat. No. 4,315,225 to Allen et al. Conductively cooled laser diode array assemblies have also been proposed, but none have been capable of handling the high heat flows generated by high output injection laser diode arrays.

SUMMARY OF THE INVENTION

Ordinarily, several of the conductively cooled laser diode arrays of this invention would be utilized to pump a central laser rod, preferably a Nd:YAG laser rod, although other uses are possible. The conductively cooled laser diode array of this invention removes the heat generated by the injection laser diodes within the individual diode heat sink assemblies by interleaving these individual diode heat sink assemblies with heat extractors which are in thermal contact with the individual diode heat sink assemblies but which are electrically isolated therefrom. The large area contact between the individual diode heat sink assemblies and the heat extractor layers ensures effective heat transport across the interface, even though electrical current across the interface is prevented. Electrical contact between adjacent interleaved layers is made by means of separate electrical contact spacers which are inserted in cut out regions of the heat extractor layers such that the contact spacers are adjacent the individual laser diodes. The array comprises, then, alternating individual diode heat sink layers and heat extractor layers which are captured between end plates, preferably by fastener means extending completely through the array substantially parallel the axis of the array. The array is then placed in thermal contact at one or both ends of the array with means for receiving and disposing of the heat generated within the conductively cooled laser diode array. The individual diodes within an array may be utilized in series with a single electrical conductive path originating at one end of the array and terminating at the other end of the array, or individual diodes within the array or individual groups of diodes within the array may be accessed in parallel, if desired, by modifying the electrical conduction paths within the array appropriately.

DETAILED DESCRIPTION OF THE INVENTION

The following detailed description of the invention is based upon one embodiment of the apparatus of this invention. Other embodiments and modifications are possible, and the reader is referred to the appended claims to ascertain the true scope of the invention.

Figure 1:
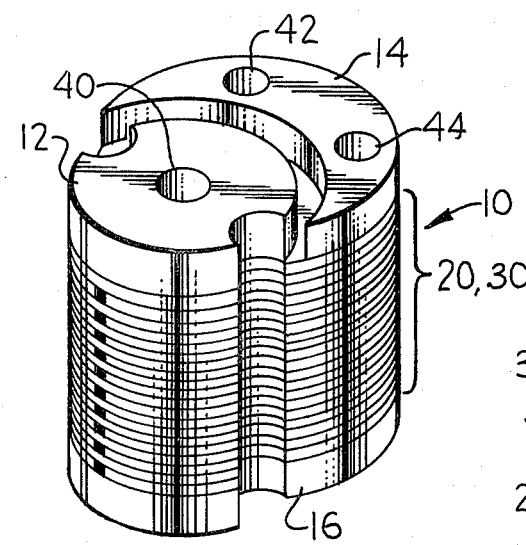
FIG. 1 is an isometric view of an assembled conductively cooled laser diode array.

Referring now the the drawings, FIG. 1 shows an assembled conductively cooled laser diode array 10. The array is capped at either end by first and second module end plate means. The first module end plate means comprises a first electrically conductive portion 12 and a second portion 14. Shown piercing the first module end plate means are three holes 40, 42 and 44 which penetrate through the entire module. The various components of the conductively cooled laser diode array module would then be clamped together by passing insulated bolts, not shown, received by appropriate nuts or other threaded means, not shown, to clamp the pieces of the array together. The second module end plate means 16 as shown in FIG. 1 is a single, electrically conducting slab. Between the first and second module end plate means are the interleaved, alternating layers of the laser diode array 20 and 30.

Figure 2:
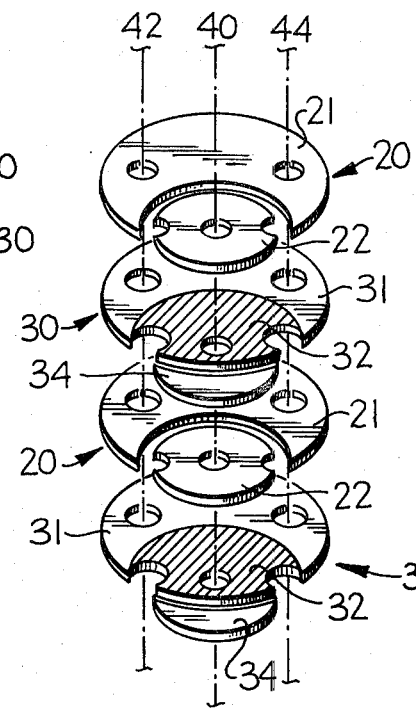
FIG. 2 is an exploded isometric view of four of the layers within the conductively cooled array.

FIG. 2 is an exploded isometric view of a portion of the various interleaved layers within the array 20 and 30. These alternating layers are termed herein as first and second plate assembly means. The first plate assembly means 20 in this embodiment comprises a laser diode assembly means 22 and a second spacer portion 21. The second plate assembly means 30 for this embodiment comprises a first heat extractor portion 31 which is covered by a dielectric layer in those regions which contact and are adjacent to the laser diode assembly 22. The second portion of the second plate assembly means comprises an electrical contact spacer means 34 which is electrically conductive and contacts the laser diode assembly 22 in the area immediately adjacent the laser diode itself. Note again the presence of the three holes 40, 42 and 44 which penetrate the array and through which suitable retention means are passed such that the array will be clamped together in a unitary structure. A plurality of these individual first and second plate assembly means 20 and 30 are alternately stacked together to form the desired array of laser diodes with interlayed heat extractor layers. Conductive paths between the laser diode assemblies 22 are provided by the presence of the electrical spacer means 34. Should the entire array be desired to be operated in series, electrical contacts, not shown, to a source of electrical energy suitable to drive the individual laser diodes within the array would be provided at each end of the array such that a single conductive path would be formed from one end of the array to the other. Should individual diodes or individual sets of diodes within the array be desired to be energized in parallel, suitable electrical contacts to the individual units along with effectively insulating layers between adjacent units would be provided. Turning again to the first plate assembly means, the second portion of the first plate assembly means comprising the thermal contact spacer means 21 could be eliminated by increasing the size of the laser diode assembly 22 to the perimeter of the first plate assembly means. Such modifications would require that the dielectric coating of the electrical contact spacer layer 31 also be extended to the perimeter of that layer. However, this modification would substantially increase the thermal resistance between layers and thereby create a higher thermal gradient within the stack.

Figure 3:
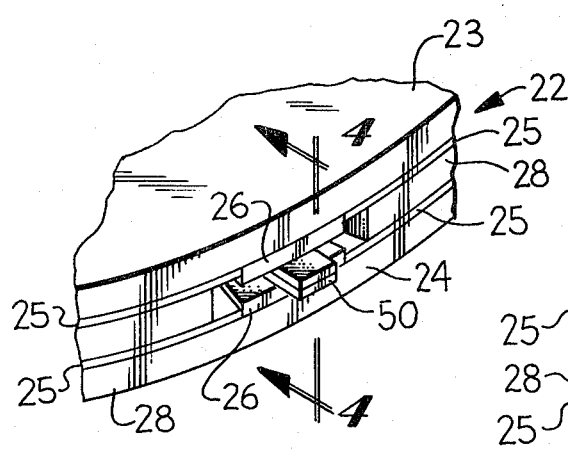
FIG. 3 is a cutaway isometric view of a portion of one of the individual laser diode assemblies.

FIG. 3 shows a cutaway isometric view of a portion of an individual laser diode assembly 22. The assembly is capped at the top and bottom by electrically conductive sheets 23 and 24. The laser diode itself 50 is sandwiched in the middle of the structure and is immediately contacted by solder layers 26 which are electrically connected to the plates 23 and 24. The remainder of the interior of the plates 23 and 24 are covered by a photoresist layer 25. Serving as a spacer for the remainder of the interior of the laser diode assembly 22 is a layer of suitable dielectrical material 28. Further construction details of the individual laser diode assemblies may be found in U.S. Pat. No. 4,315,225 which is incorporated by reference in its entirety herein.

Figure 4:
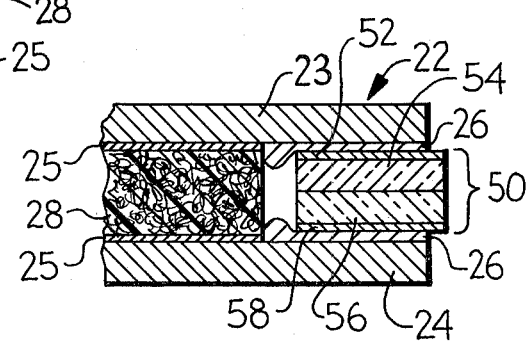
FIG. 4 is a radial sectional view taken along the section lines 4—4' in FIG. 3.

FIG. 4 is a portion of a radial vertical section taken through the laser diode assembly 22 shown in FIG. 3. Shown in this view are the top and bottom electrically conductive plates 23 and 24 which contact the laser diode 50 through the solder layers 26. Also shown are the photoresist layers 25 and the dielectric spacer layer 28. The laser diode itself 50 will normally be a double heterostructure injection laser diode capped by contact layers 52 and 58 which are adjacent the internal diode layers 54 and 56. The lasing action, of course, occurs at the interface between layers 54 and 56. Upon application of suitable electrical energy to the diode 50, the produced laser light exits the laser 50 through its outwardmost face. Note that the individual laser diode 50 is offset slightly beyond the outside edges of the upper and lower plates 23 and 24 to avoid diffraction effects upon the laser light as it leaves the laser diode 50. However, this offset will often cause localized heating of the extended front end of the laser diode with unfavorable consequences in some applications. For such cases, it may be desirable to mount the laser diode with little or no offset beyond the outer edges of the upper and lower plates.

Normally a plurality of individual condutively cooled laser diode arrays 10 will surround a central laser rod. The individual diodes 50 within the arrays 10 will be aligned such that they are immediately adjacent this central laser rod. Application of suitable electrical energy to the individual arrays 10 will cause lasing within the individual diodes 50 of the arrays which will then serve to pump the central laser rod. Such apparatus is capable of very high efficiency when compared to other laser systems.

This conductively cooled laser diode array is applicable to substantially any diode pumped laser and possesses important advantages in cost, weight, size, power consumption, reliability, and ease of operation. Its small size and power requirements make it an especially desirable candidate for portable applications.

I claim:

1. A conductively cooled laser diode stacked array comprising:

a plurality of alternating first and second plate assemblies wherein the first plate assembly of a predetermined outline comprises a laser diode assembly having mounted therein a laser diode with its output facet directed outwardly relative to the centerline of the stacked array, the diode being mounted between two conductive plates, the first plate assembly further comprising a first spacer plate which completes the predetermined outline of the first plate assembly, and wherein the second plate assembly also having the predetermined outline comprises an electrical contact spacer disposed adjacent to the laser diode assembly in the first plate assembly and a heat extractor electrically insulated from the contact spacer and from the conductive plates of the laser diode assembly, such that the electrical contact spacer and the heat extractor complete the predetermined outline of the second plate assembly, and such that the plurality of the laser diodes are oriented directly above and below one another in a line parallel to the centerline of the array;

first and second end plates in thermal communication with the first and second plate assemblies; external heat sink means to which at least one element of the group consisting of the first and second end plates is attached such that the heat generated within attacked array may be conducted thereto;

means to supply electricity to the plurality of laser diodes in the array; and means to retain the stacked array in a unitary structure.

2. The array of claim 1 wherein the laser diode assembly and the thermal contact spacer of the first plate assembly have approximately the same thickness.

3. The array of claim 1 wherein the electrical contract spacer and the heat extractor which comprise the second plate assembly have approximately the same thickness.

4. The array of claim 1 wherein the alternating first and second plate assemblies and the first and second module end plates share a substantially similar perimeter outline.

5. The stacked array of claim 1 wherein the laser diodes are electrically connected to one another in series.

6. The stacked array of claim 1 wherein the laser diodes are electrically energized in parallel.

* * * * *